US010453699B2

(12) United States Patent
Koiwa

(10) Patent No.: US 10,453,699 B2
(45) Date of Patent: Oct. 22, 2019

(54) ETCHING METHOD AND ETCHING APPARATUS

(71) Applicant: TOKYO ELECTRON LIMITED, Tokyo (JP)

(72) Inventor: Kosuke Koiwa, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/988,215

(22) Filed: May 24, 2018

(65) Prior Publication Data
US 2018/0342401 A1 Nov. 29, 2018

(30) Foreign Application Priority Data

May 25, 2017 (JP) .................................. 2017-103806

(51) Int. Cl.
H01L 21/311 (2006.01)
H01L 21/3065 (2006.01)
H01L 21/3213 (2006.01)
H01J 37/32 (2006.01)

(52) U.S. Cl.
CPC .... H01L 21/31127 (2013.01); H01J 37/3244 (2013.01); H01J 37/32091 (2013.01); H01J 37/32165 (2013.01); H01J 37/32642 (2013.01); H01J 37/32715 (2013.01); H01L 21/3065 (2013.01); H01L 21/31116 (2013.01); H01L 21/31122 (2013.01); H01L 21/31138 (2013.01); H01L 21/31144 (2013.01); H01L 21/32136 (2013.01)

(58) Field of Classification Search
CPC ......... H01L 21/02112; H01L 21/02274; H01L 21/30621; H01L 21/3065; H01L 21/31116; H01L 21/31122; H01L 21/32136; H01L 21/31127; H01L 21/31138; H01L 21/31144; H01J 37/32091; H01J 37/32165; H01J 37/3244; H01J 37/32642; H01J 37/32715; H01J 37/32449
USPC ....... 438/706, 710, 712, 714, 719, 723, 736, 438/765, 780; 156/345.24, 345.26, 156/345.29
See application file for complete search history.

(56) References Cited

U.S. PATENT DOCUMENTS

2009/0035944 A1* 2/2009 Chiang ............. H01L 21/02063 438/703
2010/0108264 A1 5/2010 Delgadino et al.
(Continued)

FOREIGN PATENT DOCUMENTS

JP 2010-109373 A 5/2010

Primary Examiner — Lan Vinh
(74) Attorney, Agent, or Firm — Rothwell, Figg, Ernset & Manbeck, P.C.

(57) ABSTRACT

An etching method includes a loading step of loading into a chamber a target substrate in which a mask film is laminated on an organic film; a first etching step of etching the organic film below the mask film by plasma of a processing gas in which a flow rate ratio of a second gas containing sulfur to a first gas containing oxygen is set to a first flow rate ratio; and a second etching step of further etching the organic film by plasma of a processing gas in which a flow rate ratio of the second gas to the first gas is set to a second flow rate ratio different from the first flow rate ratio. The first etching step and the second etching step are alternately performed multiple times.

9 Claims, 16 Drawing Sheets

(56) References Cited

U.S. PATENT DOCUMENTS

2013/0115772 A1* 5/2013 Oishi ................ H01L 21/30655
              438/694
2016/0086771 A1* 3/2016 Shimizu ............. H01L 21/0332
              156/345.28

* cited by examiner

|  | (a) | (b) | (c) | (d) |
|---|---|---|---|---|
| CYCLE (sec) | – | 2 | 3 | 5 |
| RESIDUAL MASK AMOUNT (nm) | 35.7 | 42.2 | 45.9 | 47.6 |
| Bow CD (nm) | 47.8 | 41.3 | 41.8 | 44.6 |
| BTM CD (nm) | 39.7 | 36.5 | 36.7 | 38.7 |
| Δ(Bow−BTM) (nm) | 8.1 | 4.8 | 5.2 | 5.9 |

|  | (a) | (b) | (c) | (d) | (e) |
|---|---|---|---|---|---|
| DUTY RATIO (%) | 0 | 50 | 75 | 80 | 100 |
| RESIDUAL MASK AMOUNT (nm) | 33.6 | 47.6 | 50.6 | 50.6 | 35.7 |
| Bow CD (nm) | 65.8 | 44.6 | 40.7 | 43.6 | 47.8 |
| BTM CD (nm) | 56.7 | 38.7 | 38.1 | 37.7 | 39.7 |
| Δ(Bow-BTM) (nm) | 9.1 | 5.9 | 2.6 | 5.9 | 8.1 |

|  | (a) | (b) | (c) | (d) |
|---|---|---|---|---|
| FLOW RATE RATIO (%) | 2.9 | 14.3 | 16.7 | 20 |
| RESIDUAL MASK AMOUNT (nm) | 37.4 | 42.4 | 46.4 | 46.4 |
| Bow CD (nm) | 50.0 | 41.3 | 40.7 | 37.5 |
| BTM CD (nm) | 45.4 | 36.5 | 36.1 | 28.4 |
| Δ(Bow-BTM) (nm) | 4.6 | 4.8 | 4.6 | 9.1 |

|  | (a) | (b) | (c) | (d) |
|---|---|---|---|---|
| FLOW RATE RATIO (%) | 0 | 5.7 | 14.3 | 20 |
| RESIDUAL MASK AMOUNT (nm) | 33.6 | 35.4 | 35.7 | 38.2 |
| Bow CD (nm) | 65.8 | 49.5 | 47.8 | 41.1 |
| BTM CD (nm) | 56.7 | 43.6 | 39.7 | 31.0 |
| Δ(Bow-BTM) (nm) | 9.1 | 5.9 | 8.1 | 10.1 |

US 10,453,699 B2

ETCHING METHOD AND ETCHING APPARATUS

CROSS-REFERENCE TO RELATED APPLICATIONS

This application claims priority to Japanese Patent Application No. 2017-103806 filed on May 25, 2017, the entire contents of which are incorporated herein by reference.

FIELD OF THE INVENTION

The present disclosure relates to an etching method and an etching apparatus.

BACKGROUND OF THE INVENTION

It is known that when a groove is formed in a processing target film in an etching process using plasma, so-called bowing in which a sidewall of the groove is etched excessively and a space in a middle portion of the groove is swollen occurs. The bowing problem becomes obvious as miniaturization progresses and it is difficult to control a width of the groove to a designed level. To that end, Japanese Patent Application Publication No. 2010-109373 discloses a technique for adding COS (carbonyl sulfate) gas to an etching gas such as $O_2$ (oxygen) gas, $N_2$ (nitrogen) gas, $H_2$ (hydrogen) gas or the like.

By adding COS gas to the etching gas, the bowing is suppressed to a certain extent. However, as the miniaturization progresses further, the bowing needs to be suppressed further.

SUMMARY OF THE INVENTION

In accordance with an aspect, there is provided an etching method including a loading step, a first etching step and a second etching step. In the loading step, a target substrate in which a mask film is laminated on an organic film is loaded into a chamber. In the first etching step, the organic film below the mask film is etched by plasma of a processing gas in which a flow rate ratio of a second gas containing sulfur a first gas containing oxygen is set to a first flow rate ratio. In the second etching step, the organic film is further etched by plasma of a processing gas in which a flow rate ratio of the second gas to the first gas set to a second flow rate ratio different from the first flow rate ratio. The first etching step and the second etching step are alternately performed multiple times.

In accordance with another aspect, there is provided an etching apparatus including: a chamber into which a target substrate having an organic film and a mask film laminated on the organic film is loaded; a gas supply unit configured to supply a first gas containing oxygen and a second gas containing sulfur into the chamber; an etching processing unit configured to etch the organic film below the mask film by plasma of a processing gas supplied into the chamber; and a control unit configured to control a flow rate ratio of the second gas to the first gas. The control unit is configured to perform: a first etching step in which the gas supply unit is controlled to set the flow rate ratio to a first flow rate and the etching processing unit is controlled to etch the organic film by plasma of the processing gas having the first flow rate ratio; and a second etching step in which the supply unit is controlled to set the flow rate ratio to a second flow rate ratio different from the first flow rate ratio and the etching processing unit is controlled to further etch the organic film by plasma of the processing gas having the second flow rate ratio, wherein the first etching step and the second etching step are alternately repeated multiple times in etching the organic film.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
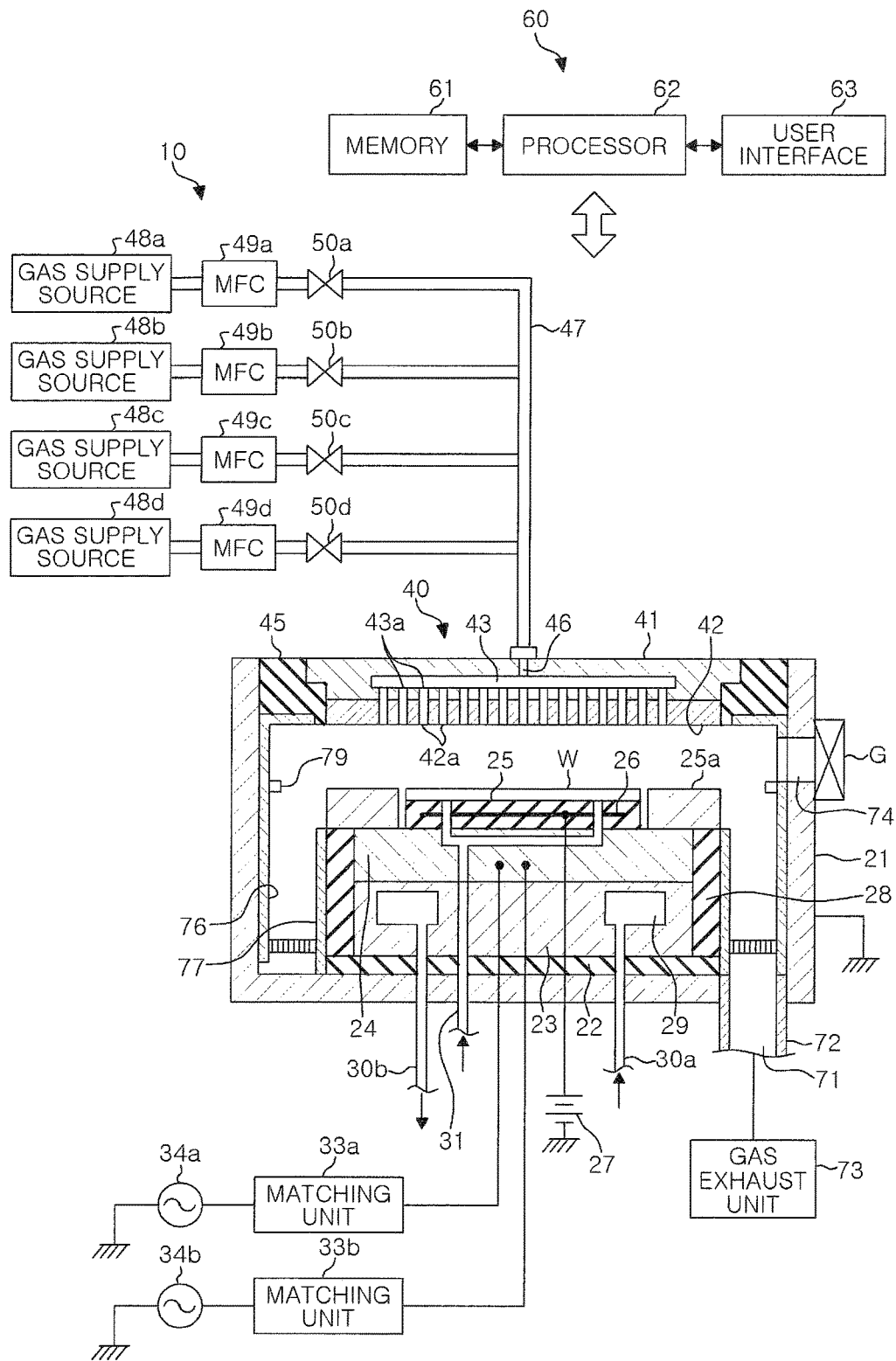
FIG. 1 shows an example of an etching apparatus.

In one embodiment, an etching method of the present disclosure includes a loading step, a first etching step and a second etching step. In the loading step, a target substrate in which a mask film is laminated on an organic film is loaded into a chamber. In the first etching step, the organic film below the mask film is etched by plasma of a processing gas in which a flow rate ratio of a second gas containing sulfur to a first gas containing oxygen is set to a first flow rate ratio. In the second etching step, the organic film is further etched by plasma of a processing gas in which a flow rate ratio of the second gas to the first gas is set to a second flow rate ratio different from the first flow rate ratio. The first etching step and the second etching step are alternately performed multiple times.

In one embodiment, the first etching step and the second etching step may be performed alternately such that a processing time of the first etching step and a processing time of the second etching step satisfies a predetermined ratio.

In one embodiment, a ratio of the processing time of the first etching step to a total processing time of the first etching step and the second etching step may be within a range from 30% to 90%.

In one embodiment, a total processing time of a single first etching step and a single second etching step may be 5 seconds or less.

In one embodiment, in the first etching step, the first gas may be supplied into the chamber at a first flow rate and the second gas may be supplied into the chamber at a second flow rate. Further, in the second etching step, the first gas may be supplied into the chamber at the first flow rate, and the second gas may be supplied into the chamber at a third flow rate smaller than the second flow rate. The flow rate or the second gas may be changed in a stepped manner between the second flow rate and the third flow rate.

In one embodiment, the third flow rate may be 0.

In one embodiment, a flow rate ratio of an average flow rate of the second gas supplied into the chamber in the first etching step and the second etching step to an average flow rate of the first gas supplied into the chamber in the first etching step and the second etching step may be 20% or less.

In one embodiment, the first gas may contain at least one of $O_2$ gas, CO gas and $CO_2$ gas, and the second gas may contain at least one of COS gas, SO gas, $SO_2$ gas and $SF_6$ gas.

In one embodiment, an etching apparatus of the present disclosure includes: a chamber into which a target substrate having an organic film and a mask film laminated on the organic film is loaded; a gas supply unit configured to supply a first gas containing oxygen and a second gas containing sulfur into the chamber; an etching processing unit configured to etch the organic film below the mask film by plasma of a processing gas supplied into the chamber; and a control unit configured to control a flow rate ratio of the second gas to the first gas. Further, the control unit is configured to perform: a first etching step in which the gas supply unit is controlled to set the flow rate ratio to a first flow rate and the etching processing unit is controlled to etch the organic film by plasma of the processing gas having the first flow rate ratio; and a second etching step in which the supply unit is controlled to set the flow rate ratio to a second flow rate ratio different from the first flow rate ratio and the etching processing unit is controlled to further etch the organic film by plasma of the processing gas having the second flow rate ratio, wherein the first etching step and the second etching step are alternately repeated multiple times in etching the organic film.

Hereinafter, embodiments of an etching method and an etching apparatus will be described in detail with reference to the accompanying drawing. The etching method and the etching apparatus of the present disclosure are not limited by the following embodiments.

(Configuration of Etching Apparatus 10)

FIG. 1 shows an example of an etching apparatus 10. As shown in FIG. 1, for example, the etching apparatus 10 includes a chamber 21 made of aluminum having an anodically oxidized surface or the like. The chamber 21 has therein a substantially cylindrical processing space. The chamber 21 is frame grounded. The etching apparatus 10 in the present embodiment is configured as a capacitively coupled parallel plate plasma processing apparatus, for example. A supporting table 23 is provided in the chamber 21 through an insulating plate 22 made of ceramic or the like. A susceptor 24 made of, e.g., aluminum or the like, and serving as a lower electrode is provided on the supporting table 23.

An electrostatic chuck 25 for attracting and holding a target substrate W by an electrostatic force provided on a substantially central portion of the susceptor 24. The electrostatic chuck 25 is an example of a mounting table. The electrostatic chuck 25 has a structure in which an electrode 26 made of a conductive film or the like is interposed between two insulating layers. A DC power supply 27 is electrically connected to the electrode 26. A heater (not shown) for heating the target substrate W may be provided at the electrostatic chuck 25.

A focus ring 25a is disposed on the susceptor 24 to surround the electrostatic chuck 25. The focus ring 25a improves uniformity of plasma near an edge of the target substrate W. The focus ring 25a is made, e.g., single crystal silicon or the like. An inner wall member 28 is provided to surround the supporting table 23 and the susceptor 24. The inner wall member 28 is formed in a substantially cylindrical shape and made of, e.g., quartz or the like.

A coolant path 29 is formed in the supporting table 23 along a circumferential direction of the supporting table 23, for example. A coolant controlled to a predetermined temperature is supplied and circulated in the coolant path 29 from an external chiller unit through lines 30a and 30b. The target substrate W on the electrostatic chuck 25 can be controlled to a predetermined temperature by heat exchange with the coolant by circulating the coolant in the coolant path 29. A heat transfer gas supplied from a gas supply unit (not shown) is supplied to a gap between an upper surface of the electrostatic chuck 25 and a backside of the target substrate W mounted on the electrostatic chuck 25 through a line 31. The heat transfer gas is, e.g., helium gas.

An upper electrode 40 is provided above the susceptor 24 serving as the lower electrode to face the susceptor 24 with the processing space in the chamber 21 interposed therebetween. A space between the upper electrode 40 and the susceptor 24 which is surrounded by the chamber 21 is a processing space in which plasma is generated. The upper electrode 40 includes a ceiling plate 42 serving as an electrode main body and a ceiling plate holding portion 41 for holding the ceiling plate 42.

The ceiling plate holding portion 41 is supported at the upper portion of the chamber 21 through an insulating member 45. The ceiling plate holding portion 41 is formed in a substantially disk shape and made of a conductive material having a relatively high thermal conductivity, e.g., aluminum having an anodically oxidized surface or the like. The ceiling plate holding portion 41 also serves as a cooling plate for cooling the ceiling plate 42 heated by the plasma generated in the processing space. The ceiling plate holding portion 41 is provided with a gas inlet port 46 for introducing a processing gas, a diffusion space 43 for diffusing the processing gas introduced from the gas inlet port 46, and a plurality of gas flow holes 43*a* as gas flow paths through which the processing gas diffused in the diffusion space 43 flows downward.

The ceiling plate 42 is formed in a substantially disk shape and made of a silicon-containing material, e.g., quartz or the like. A plurality of gas introduction holes 42*a* penetrates through the ceiling plate 42 in a thickness direction thereof. Each of the gas introduction holes 42*a* communicates with any one of the gas flow holes 43*a* of the ceiling plate holding portion 41. Accordingly, the processing gas supplied into the diffusion space 43 is diffused and supplied in a shower form into the chamber 21 through the gas flow holes 43*a* and the gas introduction holes 42*a*.

A plurality of valves 50*a* to 50*d* is connected to the gas inlet port 46 of the ceiling plate holding portion 41 through lines 47. A gas supply source 48*a* is connected to the valve 50*a* via a mass flow controller (MFC) 49*a*. When the valve 50*a* is controlled to be opened, the processing gas supplied from the gas supply source 48*a* is supplied into the chamber 21 through the line 47 at a flow rate controlled by the MFC 49*a*. In the present embodiment, the gas supply source 48*a* supplies, e.g., $CF_4$ gas, into the chamber 21.

A gas supply source 48*b* is connected to the valve 50*b* via a MFC 49*b*. When the valve 50*b* is controlled to be opened, the processing gas supplied from the gas supply source 48*b* is supplied into the chamber 21 through the line 47 at a flow rate controlled by the MFC 49*b*. In the present embodiment, the gas supply source 48*b* supplies, e.g., $CH_2F_2$ gas, into the chamber 21.

A gas supply source 48*c* is connected to the valve 50*c* via an MFC 49*c*. When the valve 50*c* is controlled to be opened, the processing gas supplied from the gas supply source 48*c* is supplied into the chamber 21 through the line 47 at a flow rate controlled by the MFC 49*c*. In the present embodiment, the gas supply source 48*b* supplies, e.g., $O_2$ gas, into the chamber 21. The $O_2$ gas is an example of a first gas containing oxygen.

A gas supply source 48*d* is connected to the valve 50*d* via an MFC 49*d*. When the valve 50*d* is controlled to be opened, the processing gas supplied from the gas supply source 48*d* is supplied into the chamber 21 through the line 47 at a flow rate controlled by the MFC 49*d*. In the present embodiment, the gas supply source 48*d* supplies COS gas into the chamber 21. The COS gas is an example of a second gas containing sulfur.

The adjustment of the gas flow rates by the MFCs 49*a* to 49*d* and the opening/closing of the valves 50*a* to 50*d* are controlled by a control unit 60 to be described later. The gas supply sources 48*a* to 48*d*, the MFCs 49*a* to 49*d*, and the valves 50*a* to 50*d* are examples of a gas supply unit.

A high frequency power supply 34*a* is electrically connected to the susceptor 24 serving as the lower electrode via a matching unit 33*a*. A high frequency power supply 34*b* is connected to the susceptor 24 via a matching unit 33*b*. The high frequency power supply 34*a* supplies a high frequency power having a first frequency of 27 MHz to 100 MHz, e.g., 40 MHz, to the susceptor 24 through the matching unit 33*a*. The high frequency power supply 34*b* supplies high frequency power having a second frequency of 400 kHz to 20 MHz, e.g., 13 MHz, the susceptor 24 through the matching unit 33*b*.

By supplying the high frequency power having the first frequency to the susceptor 24, plasma of the processing gas is generated in the processing space. The susceptor 24 and the upper electrode 40 are examples of an etching processing unit. By supplying the high frequency power having the second frequency to the susceptor 24, active species such as ions or the like in the plasma are attracted to the target substrate W on the electrostatic chuck 25. The high frequency powers supplied from the high-frequency power supplies 34*a* and 34*b* are controlled by the control unit 60 to be described later.

A gas exhaust port 71 is provided at a bottom portion of the chamber 21. A gas exhaust unit 73 is connected to the gas exhaust port 71 through a gas exhaust line 72. The gas exhaust unit 73 includes a vacuum pump, e.g., a DP (Dry Pump) or a TMP (Turbo Molecular Pump), and thus can decrease a pressure in the chamber 21 to a desired vacuum level. The gas exhaust unit 73 is controlled by the control unit 60 to be described later.

An opening 74 through which the target substrate W is loaded and unloaded is provided on the sidewall of the chamber 21. The opening 74 can be opened and closed by a gate valve G. A deposition shield 76 is detachaby provided on the inner surface of the sidewall of the chamber 21. A deposition shield is detachably provided on an outer peripheral surface of the inner wall member 28. The deposition shields 76 and 77 prevent reaction by-products (deposits) from being adhered to the inner surface of the sidewall of chamber 21 and to the inner wall member 28. A conductive member (GND block) 79 connected to the ground is provided at a portion of the deposition shield 76 at substantially the same height as the height of the target substrate W mounted on the electrostatic chuck 25. Due to the presence of the GND block 79, abnormal discharge in the chamber 21 is prevented.

The operation of the above-described etching apparatus 10 is integrally controlled by the control unit 60. The control unit 60 includes a memory 61 such as a ROM (Read Only Memory), a RAM (Random Access Memory) or the like, a processor 62 such as a CPU (Central Processing Unit), a DSP (Digital Signal Processor) or the like, and a user interface 63. The user interface 63 includes, e.g., a keyboard through which a user such as a process manager or the like inputs a command to manage the etching apparatus 10, a display for visualizing and displaying the operation state of the etching apparatus 10, and the like.

The memory 61 stores therein recipes including data of processing conditions for realizing various processes in the etching apparatus 10, and control programs (software). The processor 62 reads out a control program from the memory 61 and executes the read-out control program. Further, the processor 62 controls the respective components of the etching apparatus 10 based on the recipe or the like stored in the memory 61. Accordingly, the etching process is performed on the target substrate W by the etching apparatus 10. The recipes including the processing condition data and the control programs can be read out from a computer-readable storage medium, or can be transmitted from another device through, e.g., a communication line. The computer-readable storage medium is, e.g., a hard disk, a CD (Compact Disc), a DVD (Digital Versatile Disc), a flexible disk, a semiconductor memory, or the like.

(Structure of Target Substrate W)

Figure 2:
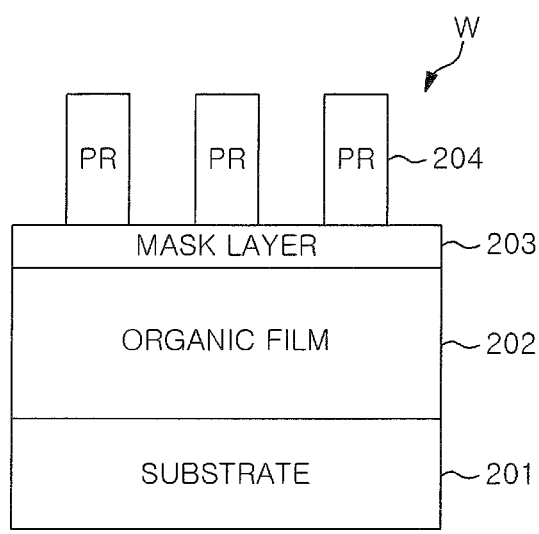
FIG. 2 is a schematic diagram showing an example of a cross section of a target substrate.

FIG. 2 is a schematic diagram showing an example of a cross section of the target substrate W. In the present embodiment, etching is performed on the target substrate W having a structure shown in FIG. 2, for example. As shown in FIG. 2, for example, the target substrate W has a structure in which an organic film 202 such as amorphous carbon or spin-on-carbon is laminated on a substrate 201 such as silicon or the like and a mask layer 203 that is a silicon-containing anti-reflection film (SiARC) such as SiON or the like is laminated on the organic film 202. Then, a PR (Photo Resist) 204 such as an ArF resist or the like is laminated on the mask layer 203. The PR 204 is patterned in a shape corresponding to a shape of an opening of a groove to be formed in the mask layer 203 and the organic film 202.

(Etching Process)

Figure 3:
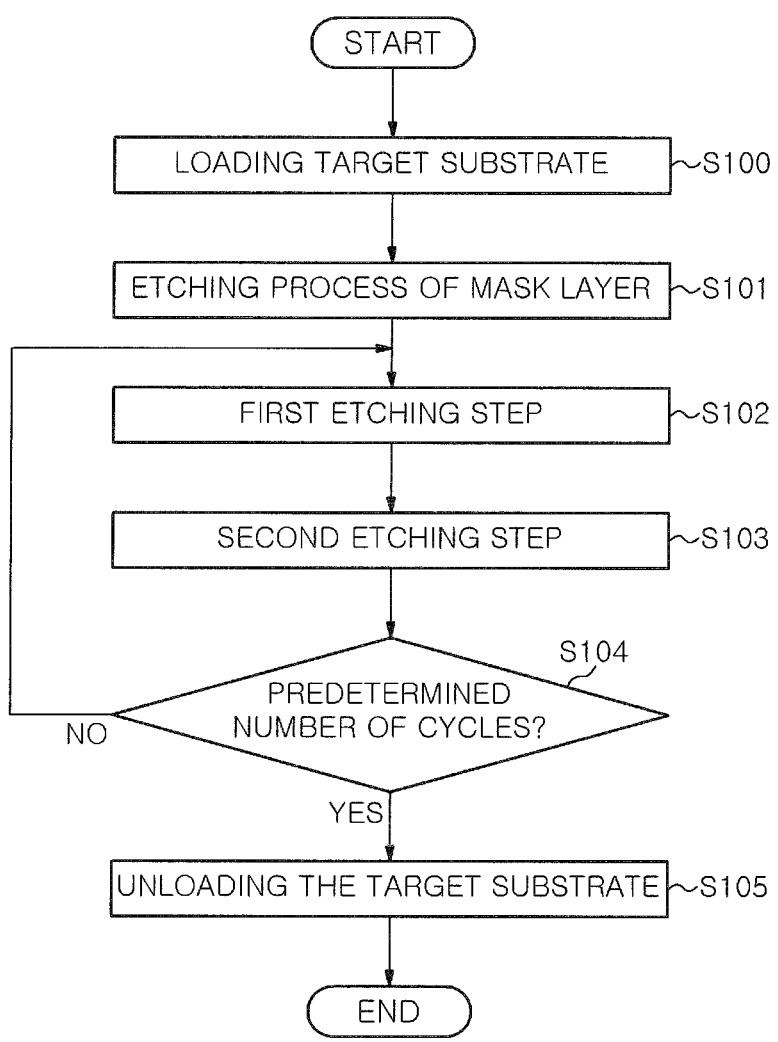
FIG. 3 is a flowchart showing an example of an etching process.

FIG. 3 is a flowchart showing an example of the etching process. The etching process shown in FIG. 3 is performed under the control of the control unit 60.

First, the gate valve G is opened, and the target substrate W is loaded into the chamber 21 (S100). The step S100 is an example of a loading process. Then, the target substrate W is mounted on the electrostatic chuck 25, and the gate valve B is closed. The control unit 60 controls the DC power supply 27 to apply a DC voltage to the electrode 26. Accordingly, the target substrate W attracted and held on the surface of the electrostatic chuck 25. Then, the control unit 60 controls the chiller unit (not shown) to adjust the temperature of the coolant circulating in the coolant chamber 29 of the supporting table 23, thereby adjusting the temperature of the target substrate W to a predetermined level.

Next, the control unit 60 executes the etching process of the mask layer 203 for a predetermined period of time (S101). In the etching process of the mask layer 203, the control unit 60 controls the gas exhaust unit 73 to exhaust the chamber 21 to a predetermined vacuum level. Then, the control unit 60 controls the valves 50a to 50c to be opened. The valve 50d is controlled to be closed.

The control unit 60 controls the MFCs 49a to 49c so that the flow rates of the $CF_4$ gas, the $CH_2F_2$ gas and the $O_2$ gas supplied from the gas supply sources 48a to 48c become predetermined flow rates, respectively. For example, the control unit 60 controls the MFCs 49a to 49c so that the flow rates of the $CF_4$ gas, the $CH_2F_2$ gas and the $O_2$ gas become 250 sccm, 25 sccm, and 5 sccm, respectively. The control unit 60 controls the gas exhaust unit 73 to adjust a pressure in the chamber 21 to a predetermined level. The control unit 60 controls a pressure in the chamber 21 to, e.g., 75 mT.

The control unit 60 controls the high frequency power supply 34a to apply a high frequency power of, e.g., 400 W, to the susceptor 24. As a consequence, plasma of the processing gas containing the $CF_4$ gas, the $CH_2F_2$ gas and the $O_2$ gas is generated between the upper electrode 40 and the susceptor 24. The control unit 60 controls the high frequency power supply 34b to apply a high frequency power of, e.g., 100 W, to the susceptor 24. Accordingly, active species such as ions or the like in the plasma are attracted to the target substrate W on the electrostatic chuck 25, and the mask layer 203 below the PR 204 is etched while using the PR 204 as a mask.

After the etching of the mask layer 203 is completed, the control unit 60 executes a first etching step for etching the organic film 202 below the mask layer 203 while using the mask layer 203 as a mask for a predetermined period of time (S102). In the first etching step, the control unit 60 controls the valves 50a and 50b to be closed and the valves 50c and 50d to be opened. The control unit 60 controls the MFCs 49c and 49d so that the flow rates of the $O_2$ gas and the COS as supplied from the gas supply sources 48c and 48d become predetermined flow rates, respectively. In the first etching step, the control unit 60 controls the MFCs 49c and 49d so that the flow rate ratio of the COS gas to the $O_2$ gas becomes a first flow rate ratio. Then, the control unit 60 controls the gas exhaust unit 73 so that a pressure in the chamber 21 becomes, e.g., 12 mT.

The control unit 60 changes the high frequency power applied from the high frequency power supply 34a to the susceptor 24 to 300 W, and stops the supply of the high frequency power from the high frequency power supply 34b to the susceptor 24. Accordingly, the organic film 202 below the mask layer 203 is etched while using the mask layer 203 as a mask by the plasma of the $O_2$ gas and the COS gas. The flow rates of the $O_2$ gas and the COS gas, and the first flow rate ratio in the first etching step will be described later.

Next, the control unit 60 executes a second etching step for further etching the organic film 202 while using the mask layer 203 as a mask for a predetermined period of time (S103). In the second etching step, the control unit 60 controls the MFCs 49c and 49d so that a flow rate ratio of the COS gas to the $O_2$ gas becomes a second flow rate ratio different from the first flow rate ratio. In the present embodiment, the second flow rate ratio is smaller than the first flow rate ratio, for example. In other words, in the second etching step of the present embodiment, the flow rate of the COS gas is smaller than that in the first etching step. Specifically, in the second etching step of the present embodiment, the control unit 60 stops the supply of the COS gas. Accordingly, in the second etching step of the present embodiment, the organic film 202 is etched mainly by the plasma of the $O_2$ gas. The pressure in the chamber 21 and the high frequency power applied from the high frequency power supply 34a to the susceptor 24 are the same as those in the first etching step. In the second etching step as well, no high frequency power is applied from the high frequency power supply 34b to the susceptor 24. The flow rates of the $O_2$ gas and the COS gas in the second etching step will be described later.

Next, the control unit 60 determines whether or not a cycle of performing the first etching step and the second etching step once has been executed a predetermined number of times (S104). When the cycle of performing the first etching step and the second etching step once has been executed a predetermined number of times, a groove having a predetermined depth is formed in the organic film 202. When the cycle of performing the first etching step and the second etching step once has not been executed the predetermined number of times (S104: No), the control unit 60 performs the first etching step of the step S102 again.

On the other hand, when the cycle of performing the first etching step and the second etching step once has been executed for the predetermined number of times (S104: Yes), the control unit 60 stops the high frequency power supplies 34a and 34b. Then, the control unit 60 controls the valves 50a to 50d to be closed and controls the gas exhaust unit 73 to exhaust the chamber 21 to a predetermined vacuum level. Then, the control unit 60 stops the application of the DC voltage from the DC power supply 27 to the electrode 26. Thereafter, the gate valve G is opened, and the target substrate W is unloaded from the chamber 21 (S105).

(Shape of Groove)

Figure 4:
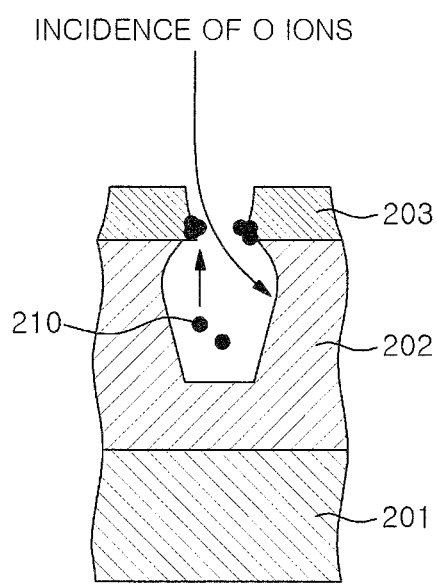
FIG. 4 is a schematic diagram showing an example of a groove forming process in a comparative example.

Here, the shape of the groove formed in the organic film 202 will be described. FIG. 4 is a schematic diagram showing an example a groove forming process in a comparative example. In the comparative example, the mask layer 203 is etched and, then, the organic film 202 is etched while using the mask layer 203 as a mask by using plasma of a mixed gas of $O_2$ gas and COS gas, for example.

In this case, an equipotential surface near the opening of the groove is distorted due to charge-up of the surface of the target substrate W or the like. Accordingly, the direction of incidence of charged particles such as O ions and the like is bent near the opening of the groove and they are introduced toward a sidewall of the groove. As a consequence, the sidewall of the groove is etched in a horizontal direction and so-called bowing occurs. Further, so-called necking in which reaction by-products 210 generated by reaction with O ions and the like on the sidewall or the bottom surface of the groove are adhered to the vicinity of the opening of the groove occurs. As a result, the opening of the groove may be narrowed and blocked.

By adding the COS gas to the $O_2$ gas, the reaction by-products 210 containing sulfur are adhered to the sidewall of the groove and the etching in the horizontal direction is suppressed. This makes it possible to suppress the occurrence of bowing to a certain extent. However, with the recent progress of miniaturization, it is required to form a groove having a high aspect ratio and to further reduce the bowing.

Figure 5A:
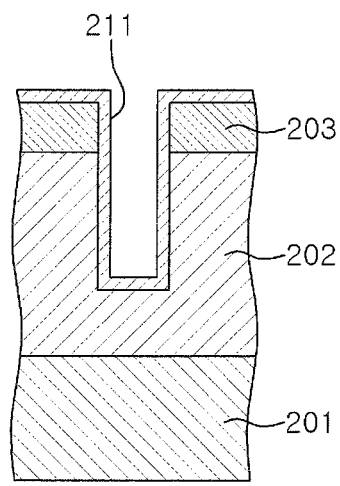
FIGS. 5A and 5B schematic diagrams showing an example of a groove forming process in an embodiment.
Figure 5B:
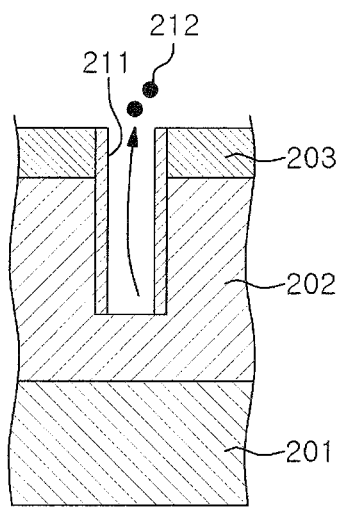

On the other hand, in the etching apparatus 10 of the present embodiment, the first etching step and the second etching step are alternately repeated when the organic film 202 is etched while using the mask layer 203 as a mask. For example, in the first etching step, the organic film 202 is etched by the plasma of the processing gas in which a flow rate ratio of the COS gas to the $O_2$ gas is adjusted to a first flow rate ratio. Accordingly, as shown in FIG. 5A, for example, the organic film 202 is etched, and reaction by-products 211 containing sulfur are adhered the sidewalls and the bottom surfaces of the mask layer 203 and the organic film 202. Therefore, the etching of the sidewall of the groove is suppressed, and the bowing is suppressed. FIGS. 5A and 5B are schematic diagrams showing an example a groove forming process in the present embodiment.

In the second etching step, the organic film 202 is etched by the plasma of the processing gas in which a flow rate ratio of the COS gas to the $O_2$ gas is adjusted to a second flow rate ratio different from the first flow rate ratio. Specifically, in the second etching step, the supply of the COS gas is stopped and the organic film 202 is etched by $O_2$ gas plasma. Accordingly, as shown in FIG. 5B, for example, the reaction by-products 211 adhered to the sidewalls and the bottom surfaces of the mask layer 203 and organic film 202 are etched and discharged as reaction by-products 212.

At this time, since the O ions are incident mainly in a thickness direction of the organic film 202, the bottom surface of the groove is etched more than the sidewall. As a consequence, the etching proceeds mainly in the thickness direction of the organic film 202. Further, since the reaction by-products 211 adhered to the sidewalls and the bottom surfaces of the mask layer 203 and the organic film 202 are entirely etched, the reaction by-products 211 adhered to the vicinity of the opening of the groove are also removed. As a result, the necking is suppressed.

Here, in the case of executing only the first etching step, as shown in FIG. 5A, for example, the reaction by-products 211 adhered to the sidewalls and the bottom surfaces of the mask layer 203 and the organic film 202 become thick and, further, the etching stops. On the other hand, in the case of executing only the second etching step, the reaction by-product 211 adhered to the sidewall of the groove as shown in FIG. 5B, for example, does not exist and, thus, the etching of the sidewall of the groove progresses and the bowing occurs.

Therefore, in the present embodiment, the first etching step and the second etching step are alternately repeated. Accordingly, the state shown in FIG. 5A and the state shown in FIG. 5B are alternately repeated, and it is possible to form a groove having a predetermined depth while suppressing bowing and necking.

(Relation Between Cycle and Groove Shape)

Figures 6, 7:
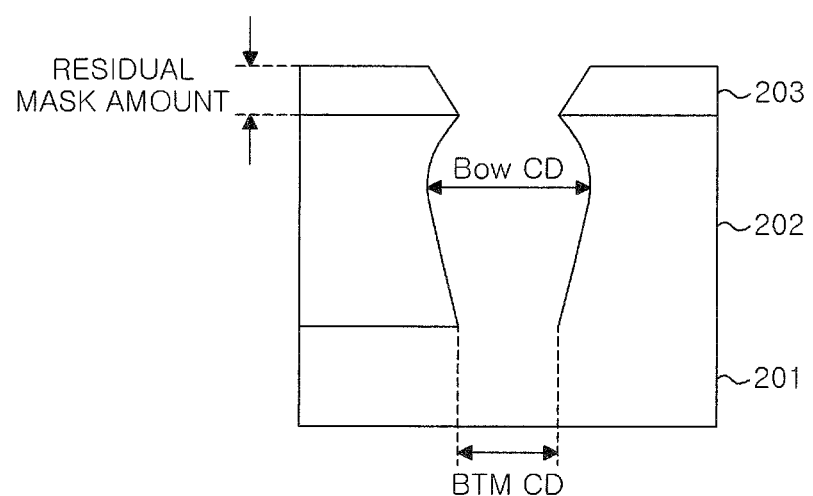
FIG. 6 shows an example of relation between etching performed under different conditions and a shape of a groove.
FIG. 7 explains examples of Bow CD, BTM CD, and a residual mask amount.

Next, a test was conducted on the shape of the groove in the case of changing a cycle of performing the first etching step and the second etching step. In one cycle, the first etching step and the second etching step are executed consecutively once. In the test, the flow rate of the $O_2$ gas was controlled to be constant, and only the flow rate of the COS gas was changed between the first etching step and the second etching step. FIG. 6 shows an example of the relation between the etching and the shape of the groove under different conditions. In case (a) of FIG. 6, the shape of the groove in the case of controlling the flow rate ratio of the gases to be constant is shown as a comparative example.

In FIG. 6, "residual mask amount" indicates the thickness of the mask layer 203 remaining on the organic film 202 at the time of completion of the etching of the organic film 202 as shown in FIG. 7, for example. FIG. 7 explains examples of Bow CD, BTM CD, and the residual mask amount. "Bow CD" is an abbreviation for Bowing Critical Dimension. As shown in FIG. 7, for example, it represents a width of the widest sidewall in the groove formed in the organic film 202. "BTM CD" is an abbreviation for Bottom Critical Dimension. As shown in FIG. 7, for example, it represents a width of the bottom surface of the groove formed in the organic film 202. "Δ(Bow−BTM)" is a difference between "Bow CD" and "BTM CD".

Figure 8:
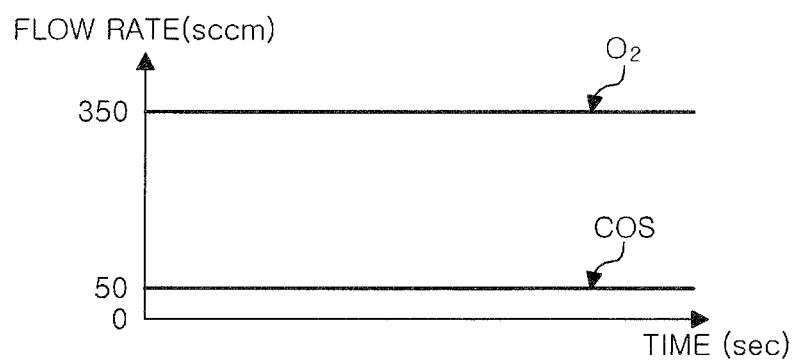
FIGS. 8 to 11 show examples of temporal changes in flow rates of $O_2$ gas and COS gas in the cases of performing etching under conditions (a) to (d) shown in FIG. 6, respectively.

Case (a) of FIG. 6 shows measured values of the shape of the groove in the case of performing etching in the comparative example. In the etching in the comparative example, as shown in FIG. 8, for example, $O_2$ gas and COS gas were supplied at a constant flow rate ratio (about 14.3% in the example of FIG. 8). FIG. 8 shows an example of temporal changes in flow rates of $O_2$ gas and COS gas in the etching shown in case (a) of FIG. 6. The flow rate of $O_2$ gas was 350 sccm and the flow rate COS gas was 50 sccm. In this case, as shown in case (a) of FIG. 6, for example, the residual mask amount was 35.7 nm; the Bow CD was 47.8 mm; the BTM CD was 39.7 nm; and the Δ(Bow−BTM) was 8.1 nm.

Figure 9:
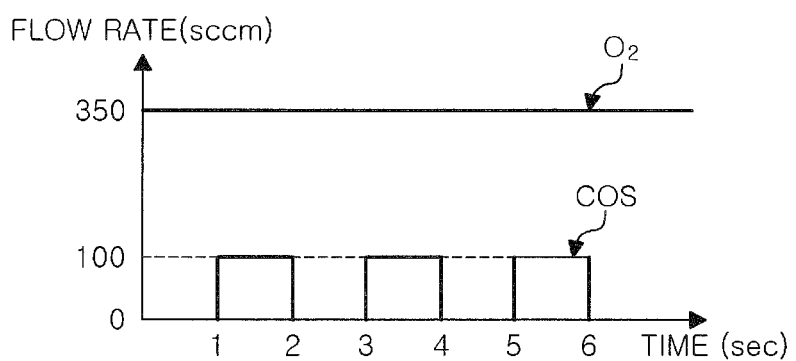

Case (b) of FIG. 6 shows measured values of the groove shape in the case of repeating the first etching step and the second etching step at a cycle of 2 seconds. In the etching shown in case (b) of FIG. 6, $O_2$ gas is supplied at a constant flow rate, and supply of COS gas and stop of the supply of COS gas are repeated every second, as shown in FIG. 9, for example. FIG. 9 shows an example of temporal changes in flow rates of $O_2$ gas and COS gas in the etching shown in case (b) of FIG. 6. In the temporal changes of the COS gas shown in FIG. 9, the first etching step is executed during a period in which the COS gas is supplied, and the second etching step is executed during a period in which the supply of the COS gas is stopped.

In the example of FIG. 9, the flow rate of the $O_2$ gas is 350 sccm and the flow rate of the COS gas, if supplied, is 100 sccm. When the supply of the COS gas is stopped, the flow rate ratio of the COS gas to the $O_2$ gas is 0. When the COS gas is supplied, the flow rate ratio of the COS gas to the $O_2$ gas is about 28.6. Further, in the example of FIG. 9, since a duty ratio of the COS gas is 50%, an average flow rate of the COS gas is 50 sccm and an average flow rate ratio of the COS gas to the O$_2$ gas is about 14.3%. In case (b) of FIG. 6, the first etching step is performed by the plasma of the processing gas having the flow rate ratio of the COS gas to the O$_2$ gas of about 29%, and the second etching step is performed by the plasma of the processing gas having the flow rate ratio of the COS gas to the O$_2$ gas of 0%.

When the first etching step and the second etching step were repeatedly executed at a cycle of 2 seconds, the residual mask amount was 42.2 nm; the Bow CD was 41.3 nm; the BTM CD was 36.5 nm; and Δ(Bow–BTM) was 4.8 nm, as shown in case (b) of FIG. 6, for example.

Figure 10:
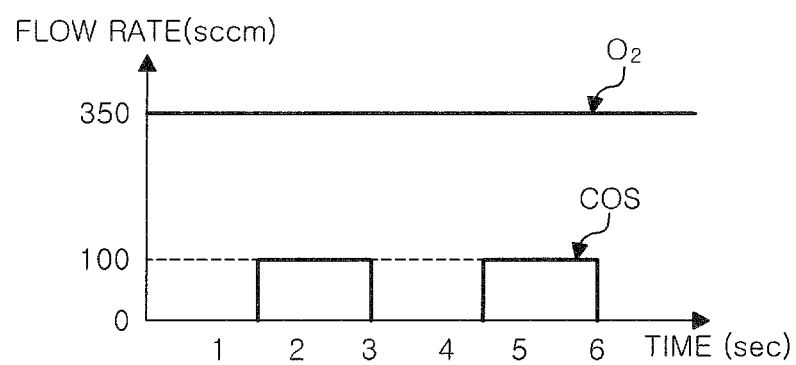

Case (c) of FIG. 6 shows measured values of the groove shape in the case or repeating the first etching step and the second etching step at a cycle of 3 seconds. In the etching shown in case (c) of FIG. 6, O$_2$ gas is supplied at a constant flow rate, and supply of COS gas and stop of the supply of COS gas are repeated every 1.5 seconds, as shown in FIG. 10, for example. FIG. 10 shows an example of temporal changes in the flow rates of O$_2$ gas and COS gas in the etching shown in case (c) of FIG. 6.

In the example of FIG. 10, the flow rate of the O$_2$ gas is 350 sccm; the flow rate of the COS gas, if supplied, is 100 sccm; and the average flow rate ratio of the COS gas to the O$_2$ gas is about 14.3%. When the first etching step and the second etching step were repeatedly executed at a cycle of 3 seconds, the residual mask amount was 45.9 nm; the Bow CD was 41.8 nm; the BTM CD was 36.7 nm; and Δ(Bow–BTM) was 5.2 nm, as shown in case (c) of FIG. 6, for example.

Figure 11:
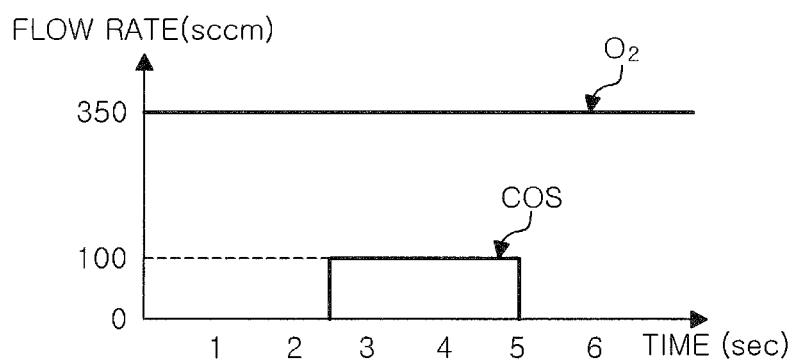

Case (d) of FIG. 6 shows measured values of the groove shape in the case of repeating the first etching step and the second etching step at a cycle of 5 seconds. In the etching shown in case (d) of FIG. 6, O$_2$ gas is supplied at a constant flow rate and supply of COS gas and stop of the supply of COS gas are repeated every 2.5 seconds, as shown in FIG. 11, for example. FIG. 11 shows an example of temporal changes in the flow rates of O$_2$ gas and COS gas in the etching shown in case (d) of FIG. 6.

In the example of FIG. 11, the flow rate of the O$_2$ gas is 350 sccm; the flow rate of the COS gas, if supplied, is 100 sccm; and the average flow rate ratio of the COS gas to the O$_2$ gas is about 14.3%. When the first etching step and the second etching step were repeatedly executed at a cycle of 5 seconds, the residual mask amount was 47.6 nm; the Bow CD was 44.6 nm; the BTM CD was 38.7 nm; and Δ(Bow–BTM) was 5.9 nm, as shown in case (d) of FIG. 6, for example.

Figure 12:
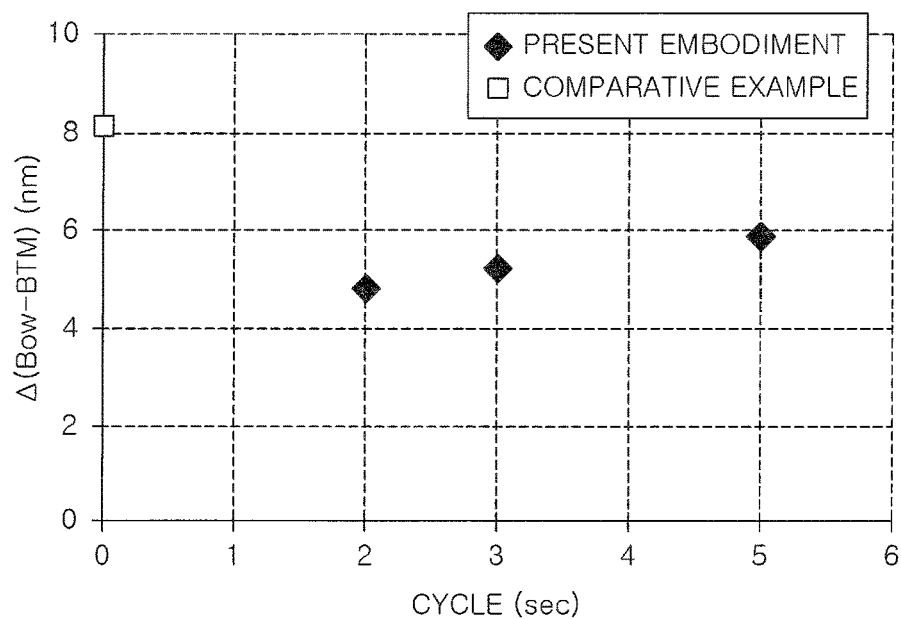
FIG. 12 shows an example of relation between a cycle of performing a first etching step and a second etching step once and Δ(Bow−BTM)

Changes in Δ(Bow–BTM) with respect to a cycle of performing the first etching step and the second etching step once are shown in FIG. 12, for example. FIG. 12 shows an example of relation between the cycle in which the first etching step and the second etching step are performed once and Δ(Bow–BTM). Referring to FIG. 12, the value of Δ(Bow–BTM) is smaller in the case of repeating the first etching step and the second etching step alternately as in the present embodiment than in the case of performing etching using O$_2$ gas and COS gas supplied at a constant flow rate as in the comparative example. The comparative example corresponds to a conventional etching method. A smaller value of Δ(Bow–BTM) indicates smaller bowing of the groove formed in the organic film 202. Therefore, by repeating the first etching step and the second etching step alternately as in the present embodiment, the bowing can be reduced compared to that in the conventional case.

Referring to FIG. 12, the value of Δ(Bow–BTM) tends to be gradually increased as the cycle of the first etching step and the second etching step becomes longer. Even in that case, as long as the cycle of the first etching step and the second etching step is 5 seconds or less, the bowing can be reduced compared to that in the conventional case. From the result of FIG. 12, it is clear that the bowing can be reduced compared to that in the conventional case as long as the cycle of the first etching step and the second etching step is within a range from 2 seconds to 5 seconds.

Figure 13:
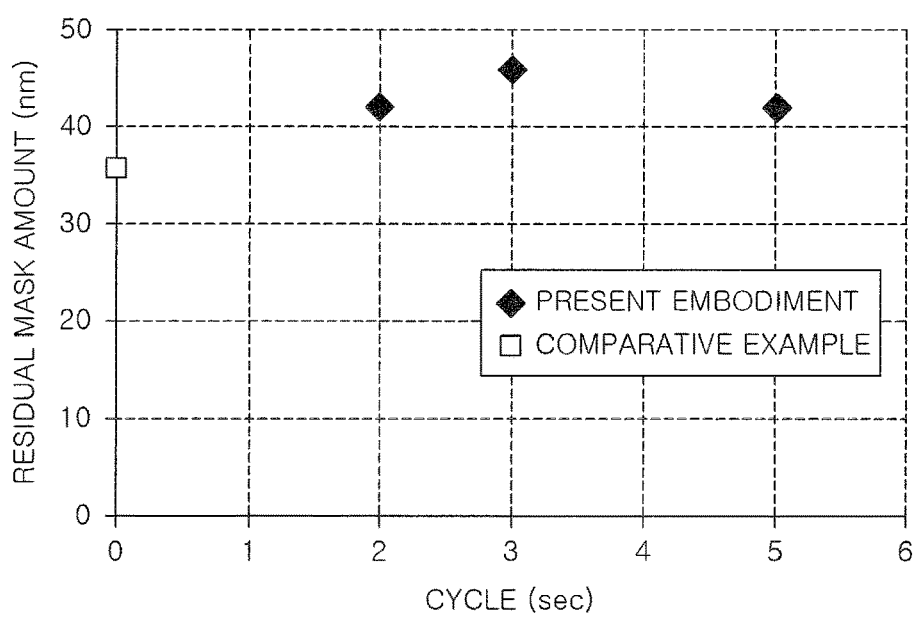
FIG. 13 shows an example of relation between a cycle of performing the first etching step and the second etching once and a residual mask amount.

Changes in the residual mask amount with respect to the cycle of the first etching step and the second etching step are shown in FIG. 13, for example. FIG. 13 shows an example of relation between the cycle of performing the first etching step and the second etching step once and the residual mask amount. As shown in FIG. 13, for example, when the cycle of the first etching step and the second etching step is within a range from 2 seconds to 5 seconds, the residual mask amount can be greater than that in the conventional case. Therefore, the cycle of the first etching step and the second etching step is preferably 5 seconds or less. Further, the cycle of the first etching step and the second etching step is preferably within a range from 2 seconds to 5 seconds. In FIGS. 12 and 13, the average flow rate ratio of the COS gas to the O$_2$ gas is about 14.3% in both of the embodiment and the comparative example.

As shown in FIGS. 9 to 11, for example, the flow rate of the COS gas is changed in a stepped manner between the first etching step and the second etching step. In the present embodiment, since the flow rate of the COS gas in the second etching step becomes 0, the supply of the COS gas is switched on and off in a pulsed manner between the first etching step and the second etching step.

(Relation Between Duty Ratio and Shape of Groove)

Figures 14, 15:
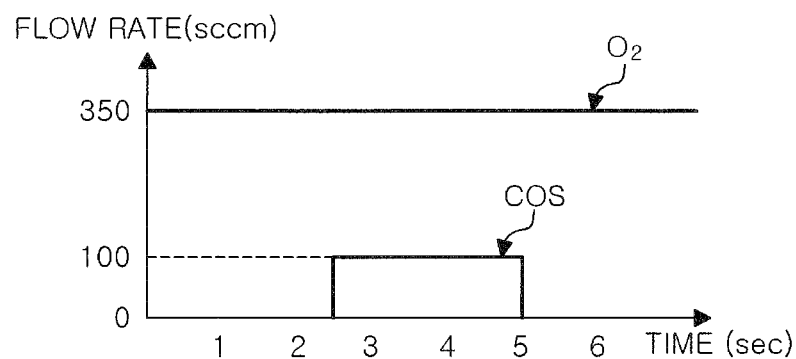
FIG. 14 shows an example of relation between a duty ratio and a shape of a groove.
FIG. 15 is a graph showing an example of temporal changes in flow rates of $O_2$ gas and COS gas at a duty ratio of 50%.

Next, a test was conducted on the shape of the groove in the case of changing a ratio of a processing time of the first etching step which is included in a processing time of one cycle of performing the first etching step and the second etching step. Hereinafter, the ratio of the processing time of the first etching step which is included in the processing time of one cycle of performing the first etching step and the second etching step once is defined as a duty ratio. FIG. 14 shows an example of the relation between the duty ratio and the shape of the groove. In cases (a) and (e) of FIG. 14, the shapes of the grooves obtained when the duty ratio is 0% and 100% are also shown as comparative examples.

Case (a) of FIG. 14 shows measured values of the shape of the groove in the case of performing etching in the comparative example. In the etching shown in case (a) of FIG. 14, the supply of the COS gas was stopped, and the organic film 202 was etched only by using the O$_2$ gas. The flow rate of the O$_2$ gas was 350 sccm. In this case, the residual mask amount was 33.6 nm; Bow CD was 65.8 nm; BTM CD was 56.7 nm; and Δ(Bow–BTM) was 9.1 nm, as shown in case (a) of FIG. 14, for example.

Case (b) of FIG. 14 shows measured values of the shape of the groove at the duty ratio of 50%. In the etching shown in case (b) of FIG. 14, O$_2$ gas is supplied at a constant flow rate, and supply of COS gas and stop of the supply of COS gas are repeated at a (cycle of 5 seconds, as shown in FIG. 15, for example. FIG. 15 shows an example of temporal changes in flow rates of O$_2$ gas and COS gas at the duty ratio of 50%. As shown in FIG. 15, the COS gas is supplied for 2.5 seconds during one cycle, and the supply of the COS gas is stopped for 2.5 seconds.

In the example of FIG. 15, the flow rate of the O$_2$ gas is 350 sccm, and the flow rate of the COS gas, if supplied, is 100 sccm. Further, in the example of FIG. 15, since the duty ratio of the COS gas is 50%, an average flow rate of the COS gas is 50 sccm and an average flow rate ratio of the COS gas to the $O_2$ gas is about 14.3%. When the duty ratio is 50%, the residual mask amount was 47.6 nm; Bow CD was 44.6 nm; BTM CD was 38.7 nm; and $\Delta$(Bow–BTM) was 5.9 nm, as shown in case (b) of FIG. 14, for example.

Figure 16:
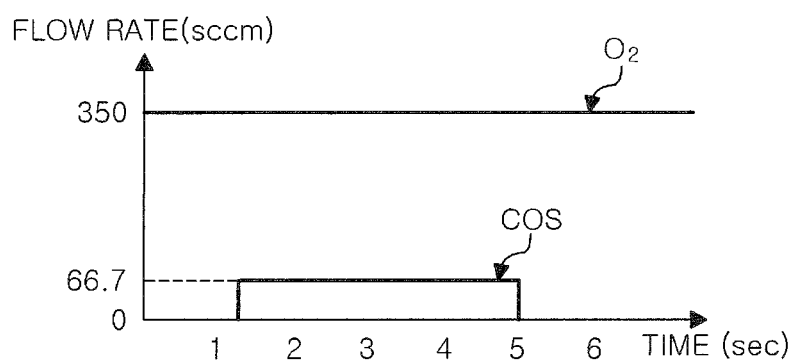
FIG. 16 is a graph showing an example of temporal changes in flow rates of $O_2$ gas and COS gas at a duty ratio of 75%.

Case (c) of FIG. 14 shows measured values of the shape of the groove at the duty ratio of 75%. In the etching shown in case (c) of FIG. 14, $O_2$ gas is supplied at a constant flow rate, and supply of COS gas and stop of the supply of COS gas are repeated at a cycle of 5 seconds, as shown in FIG. 16, for example. FIG. 16 shows an example of temporal changes in flow rates of $O_2$ gas and COS gas at the duty ratio of 75%. As shown in FIG. 16, the COS gas is supplied for 3.75 seconds during one cycle, and the supply of the COS gas is stopped for 1.25 seconds.

In the example of FIG. 16, the flow rate of the $O_2$ gas is 350 sccm, and the flow rate of the COS gas, if supplied, is 66.7 sccm. In the example of FIG. 16, since the duty ratio of the COS gas is 75%, an average flow rate of the COS gas is about 50 sccm and an average flow rate ratio of the COS gas to the $O_2$ gas is about 14.3%. When the duty ratio is 75%, the residual mask amount was 50.6 mm; Bow CD was 40.7 nm; BTM CD was 38.1 nm; and $\Delta$(Bow–BTM) was 2.6 nm, as shown in case (c) of FIG. 14, for example.

Figure 17:
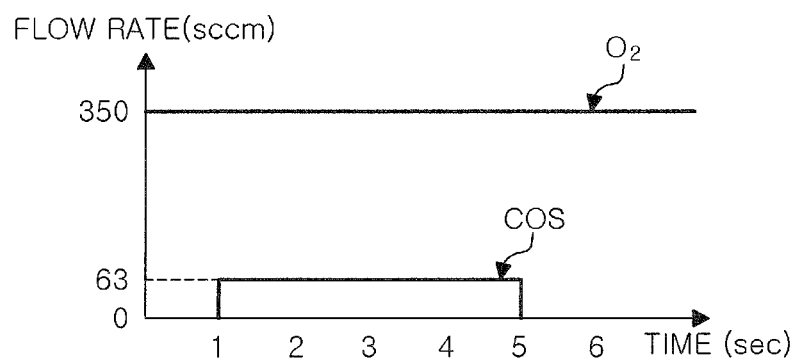
FIG. 17 is a graph showing an example of temporal changes in flow rates of $O_2$ gas and COS gas at a duty ratio of 80%.

Case (d) of FIG. 14 shows measured values of the shape of the groove at the duty ratio of 80%. In the etching shown in case (d) of FIG. 14, $O_2$ gas is supplied at a constant flow rate, and supply of COS gas and stop of the supply of COS gas are repeated at a cycle of 5 seconds, as shown in FIG. 17, for example. FIG. 17 shows an example of temporal changes in flow rates of $O_2$ gas and COS gas at the duty ratio of 80%. As shown in FIG. 17, the COS gas is supplied for 4 seconds during one cycle, and the supply of the COS gas is stopped for 1 second.

In the example of FIG. 17, the flow rate of the $O_2$ gas is 350 sccm, and the flow rate of the COS gas, is supplied, is 63 sccm. In the example of FIG. 16, since the duty ratio of the COS gas is 80%, an average flow rate of the COS gas is about 50 sccm and an average flow rate ratio of the COS gas to the $O_2$ gas is about 14.3%. When the duty ratio is 80%, the residual mask amount was 50.6 nm; the Bow CD was 43.6 nm; the BTM CD was 37.7 nm; and the $\Delta$(Bow–BTM) was 5.9 nm, as shown in case (d) of FIG. 14, for example.

Case (e) of FIG. 14 shows measured values of the shape of the groove at the duty ratio of 100%. The etching shown in case (e) of FIG. 14 corresponding to the etching of the comparative example shown in case (a) of FIGS. 6 and 8. At this time, an average flow rate ratio of COS gas to $O_2$ gas is about 14.3%. When the duty ratio is 100%, the residual mask amount was 35.7 nm; Bow CD was 47.8 nm; BTM CD was 39.7 nm; and $\Delta$(Bow–BTM) was 8.1 nm, as shown in case (e) of FIG. 14, for example.

Figure 18:
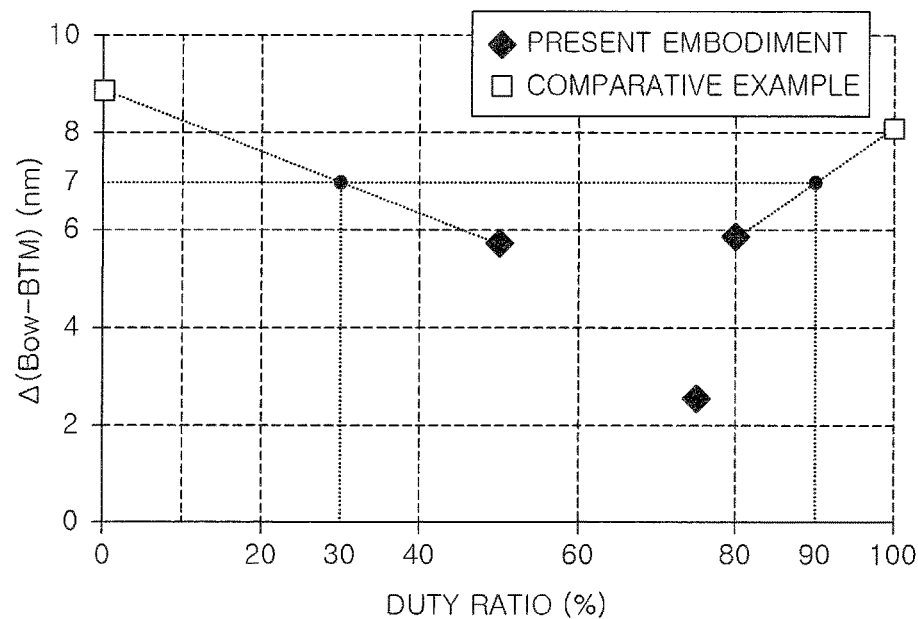
FIG. 18 shows an example of relation between a duty ratio and Δ(Bow−BTM)

Changes in $\Delta$(Bow–BTM) with respect to the duty ratio are shown in FIG. 18, for example. FIG. 18 shows an example of the relation between the duty ratio and $\Delta$(Bow–BTM). Referring to FIG. 18, the value of $\Delta$(Bow–BTM) is smaller in the case of repeating the first etching step and the second etching step alternately as in the present embodiment than in the case of performing etching using $O_2$ gas and COS gas supplied at a constant flow rate as in the comparative example.

Here, on the assumption that variation of the measured value is 1 nm, the value of $\Delta$(Bow–BTM) of 7 nm or less is considered to be smaller than that in the comparative example (conventional case). Referring to FIG. 18, when the value of the duty ratio is within a range from 30% to 90%, the value of $\Delta$(Bow–BTM) is 7 nm or less.

Figure 19:
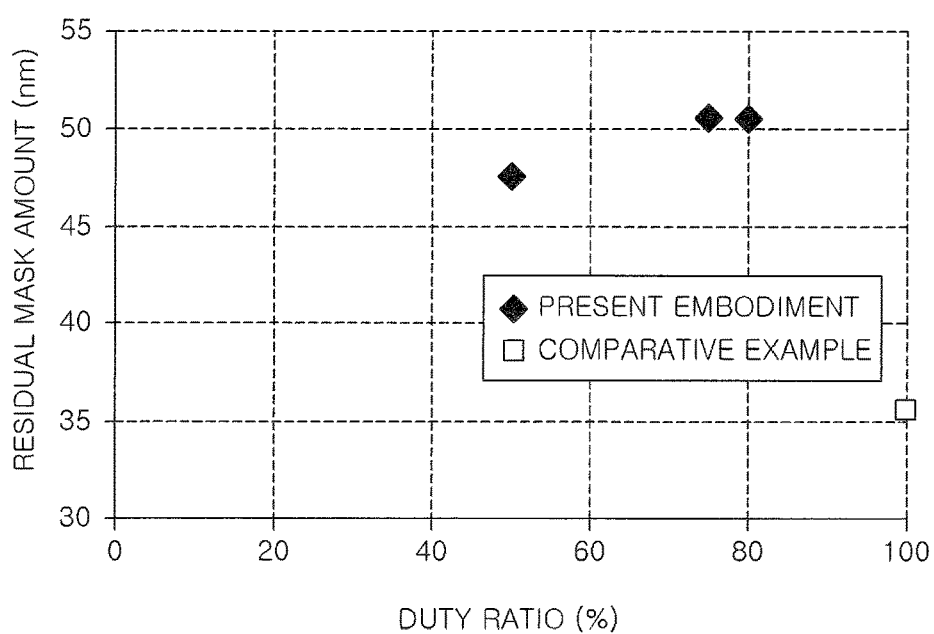
FIG. 19 shows an example of relation between a duty ratio and a residual mask amount.

Changes in the residual mask amount with respect to the duty ratio are shown in FIG. 19, for example. FIG. 19 shows an example of the relation between the duty ratio and the residual mask amount. As shown in FIG. 19, for example, when the value of the duty ratio is within the range from 30% to 90%, the residual mask amount can be greater than that in the comparative example (conventional case). Therefore, the duty ratio that is the ratio of the processing time of the first etching step which is included in the processing time of one cycle of performing the first etching step and the second etching step once is preferably greater than or equal to 30% and smaller than or equal to 90%. In FIGS. 18 and 19, an average flow rate ratio of COS gas to $O_2$ gas in the case of supplying the COS gas is about 14.3% in both of the embodiment and the comparative example.

(Relation Between Flow Rate Ratio and Shape of Groove)

Figures 20, 21:
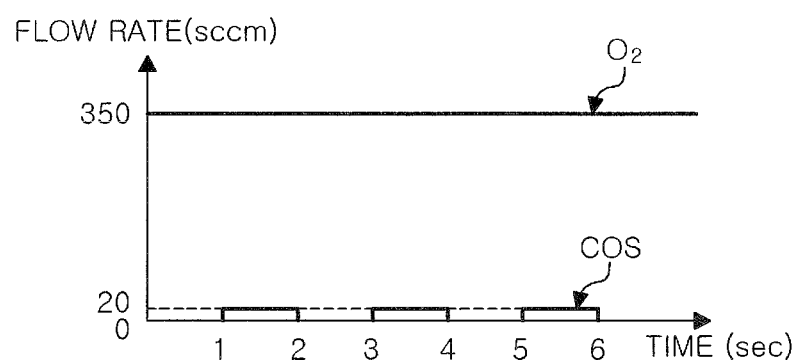
FIG. 20 shows an example of relation between a flow rate ratio of an average flow rate of the COS gas to an average flow rate of the $O_2$ gas and a shape of a groove in an embodiment.
FIG. 21 shows an example of temporal changes in flow rates of $O_2$ gas and COS gas at a flow rate ratio of 2.9%.

Next, a test was conducted on the shape of the groove in the case of changing the flow rate ratio of COS gas to $O_2$ gas. FIG. 20 shows an example of relation between the shape of the groove and a flow rate ratio of an average flow rate of the COS gas to an average flow rate of the $O_2$ gas in the embodiment.

Case (a) of FIG. 20 shows measured values of the groove shape which are obtained when the flow rate ratio of the average flow rate of the COS gas to the average flow rate of the $O_2$ gas is 2.9%. In the etching shown in case (a) of FIG. 20, $O_2$ gas is supplied at a constant flow rate, and supply of COS gas and stop of the supply of COS gas are repeated at a cycle of 2 seconds, as shown in FIG. 21, for example. FIG. 21 shows an example of temporal changes in the flow rates of the $O_2$ gas and the COS gas when the flow rate ratio is 2.9%.

As shown in FIG. 21, supply of COS gas and stop of the supply of COS gas are repeated at a duty ratio of 50%. The flow rate of the $O_2$ gas is 350 sccm, and the flow rate of the COS gas, if supplied, is 20 sccm. Therefore, an average flow rate of the COS gas is 10 sccm, and the flow rate ratio of the average flow rate of the COS gas to the average flow rate of the $O_2$ gas is about 2.9%. When the flow rate ratio of the average flow rate of the COS gas to the average flow rate of the $O_2$ gas is 2.9%, the residual mask amount was 37.4 nm; the Bow CD was 50.0 nm; the BTM CD was 45.4 nm; and $\Delta$(Bow–BTM) was 4.6 nm, as shown in case (a) of FIG. 20, for example.

Figure 22:
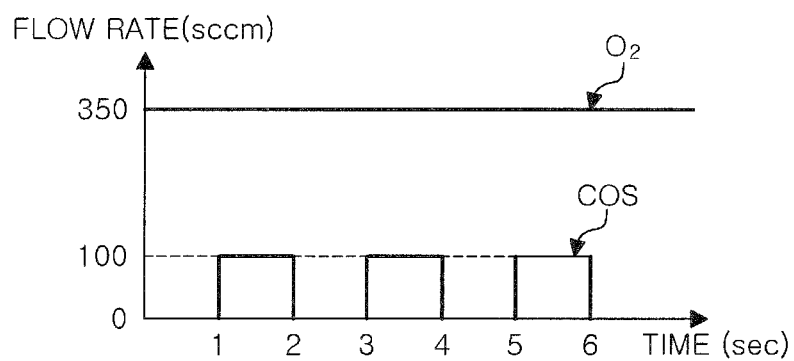
FIG. 22 shows an example of temporal changes in flow rates of $O_2$ gas and COS gas at a flow rate ratio of 14.3%.

Case (b) of FIG. 20 shows measured values of the groove shape which are obtained when the flow rate ratio of the average flow rate of the COS gas to the average flow rate of $O_2$ gas is 14.3%. In the etching shown in case (b)) of FIG. 20, $O_2$ gas is supplied at a constant flow rate, and supply of COS gas and stop of the supply of COS gas are repeated at a cycle of 2 seconds, as shown in FIG. 22, for example. FIG. 22 shows an example of temporal changes in the flow rates of $O_2$ gas and COS gas when the flow rate ratio is 14.3%.

As shown in FIG. 22, supply of COS gas and stop of the supply of COS gas are repeated at a duty ratio of 50%. The flow rate of the $O_2$ gas is 350 sccm, and the flow rate of the COS gas, if supplied, is 100 sccm. Therefore, an average flow rate of the COS gas is 50 sccm, and the flow rate ratio of the average flow rate of the COS gas to the average flow rate of the $O_2$ gas is about 14.3%. When the flow rate ratio of the average flow rate of COS gas to the average flow rate of $O_2$ gas is 14.3%, the residual mask amount was 42.4 nm; the Bow CD was 41.3 nm; the BTM CD was 36.5 nm; and $\Delta$(Bow–BTM) was 4.8 nm, as shown in case (b) of FIG. 20, for example.

Figure 23:
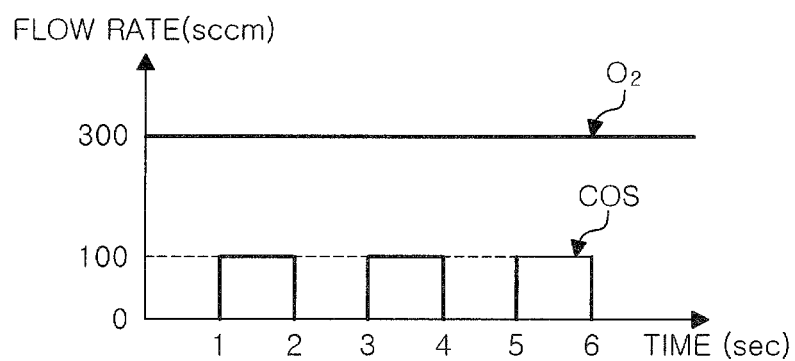
FIG. 23 shows an example of temporal changes in flow rates of $O_2$ gas and COS gas at a flow rate ratio of 16.74%.

Case (c) of FIG. 20 shows measured values of the groove shape which are obtained when the flow rate ratio of the average flow rate of the COS gas to the average flow rate of the $O_2$ gas is 16.7%. In the etching shown in case (c) of FIG. 20, $O_2$ gas is supplied at a constant flow rate, and supply of COS gas and stop of the supply of COS gas are repeated at a cycle of 2 seconds, as shown in FIG. 23, for example. FIG. 23 shows an example of temporal changes in the flow rates of the $O_2$ gas and the COS gas when the flow rate ratio is 16.7%.

As shown in FIG. 23, supply of COS gas and stop of the supply of COS gas are repeated at a duty ratio of 50%. The flow rate of the $O_2$ gas is 300 sccm, and the flow rate of the COS gas, if supplied, is 100 sccm. Therefore, an average flow rate of the COS gas is 50 sccm, and the flow rate ratio of the average flow rate of the COS gas to the average flow rate of the $O_2$ gas is about 16.7%. When the flow rate ratio of the average flow rate of the COS gas to the average flow rate of the $O_2$ gas is 16.7%, the residual mask amount was 46.4 nm; the Bow CD was 40.7 nm; the BTM CD was 36.1 nm; and Δ(Bow–BTM) was 4.6 nm, as shown in case (c) of FIG. 20, for example.

Figures 24, 25:
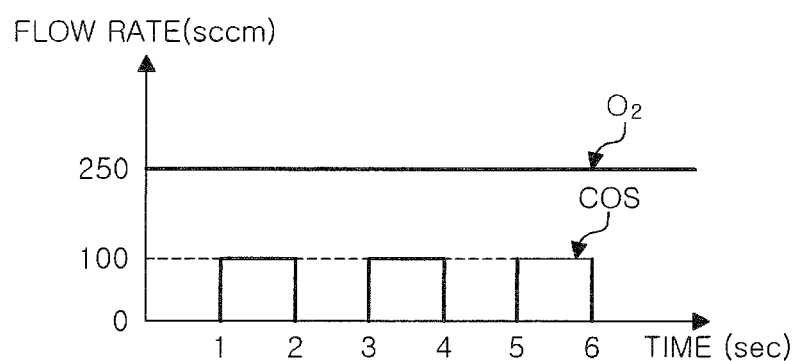
FIG. 24 shows an example of temporal changes in flow rates of $O_2$ gas and COS gas at a flow rate ratio of 20%.
FIG. 25 shows an example of relation between a flow rate ratio of an average flow rate of the COS gas to an average flow rate of the $O_2$ gas and a shape of a groove in a comparative example.

Case (d) of FIG. 20 shows measured values of the groove shape which are obtained when the flow rate ratio of the average flow rate of the COS gas to the average flow rate of the $O_2$ gas is 20%. In the etching shown in case (d) of FIG. 20, $O_2$ gas is supplied at a constant flow rate, and supply of COS gas and stop of the supply of COS gas are repeated at a cycle of 2 seconds, as shown in FIG. 24, for example. FIG. 24 shows an example of temporal changes in flow rates of $O_2$ gas and COS gas when the flow rate ratio is 20%.

As shown in FIG. 24, supply of COS gas and stop of the supply of COS gas are repeated at a duty ratio of 50%. The flow rate of the $O_2$ gas is 250 sccm, and the flow rate of the COS gas, if supplied, is 100 sccm. Therefore, an average flow rate of the COS gas is 50 sccm, and the flow rate ratio of the average flow rate of the COS gas to the average flow rate of the $O_2$ gas is 20%. When the flow rate ratio of the average flow rate of COS gas to the average flow rate of $O_2$ gas is 20%, the residual mask amount was 46.4 nm; the Bow CD was 37.5 nm; the BTM CD was 28.4 nm; and Δ(Bow–BTM) was 9.1 nm, as shown in case (d) of FIG. 20, for example.

In the comparative example, the COS gas was not added to the $O_2$ gas or the COS gas was added at a constant flow rate to the $O_2$ gas. The shape of the groove obtained at that time is shown in FIG. 25, for example. FIG. 25 shows an example of relation between the shape of the groove and the flow rate ratio of the average flow rate of the COS gas to the average flow rate of the $O_2$ gas in the comparative example.

Figure 26:
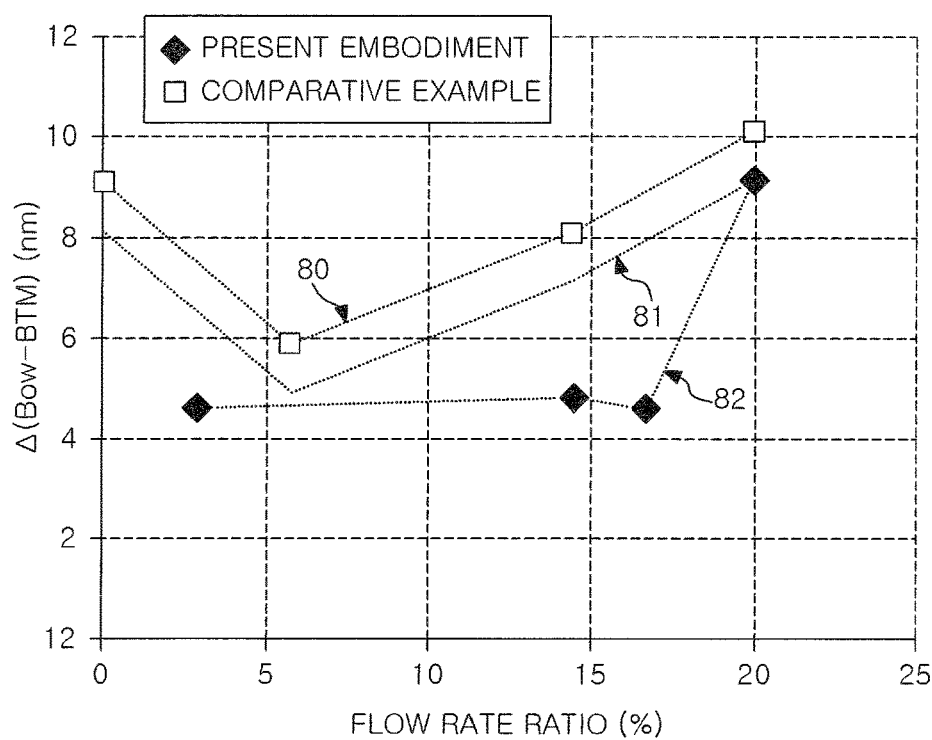
FIG. 26 shows an example of relation between a flow rate ratio and Δ(Bow–BTM)

Changes in Δ(Bow–BTM) with respect to the flow rate ratio are shown in FIG. 26, for example. FIG. 26 shows an example of relation between the flow rate ratio and Δ(Bow–BTM). In FIG. 26, the data of the embodiment shown in FIG. 20 and the data of the comparative example shown in FIG. 25 are plotted together. Referring to FIG. 26, in the present embodiment, the value of Δ(Bow–BTM) tends to be increased as the flow rate ratio is increased. Here, on the assumption that the variation of the measurement value is 1 nm, the values of Δ(Bow–BTM) in the comparative example are considered to be deviated to values on a line 81 shifted by 1 nm from a line 80 indicating the trend of Δ(Bow–BTM) in the comparative example. On the other hand, at the same flow rate ratio within a range of 20% or less, values on a line 82 showing the trend of Δ(Bow–BTM) in the present embodiment are smaller than those on the line 81 considering the variation of Δ(Bow–BTM) in the comparative example. Therefore, when the flow rate ratio of the average flow rate of the COS gas to the average flow rate of the $O_2$ gas is 20% or less, the value of Δ(Bow–BTM) can be reduced compared to that in the conventional case.

Figure 27:
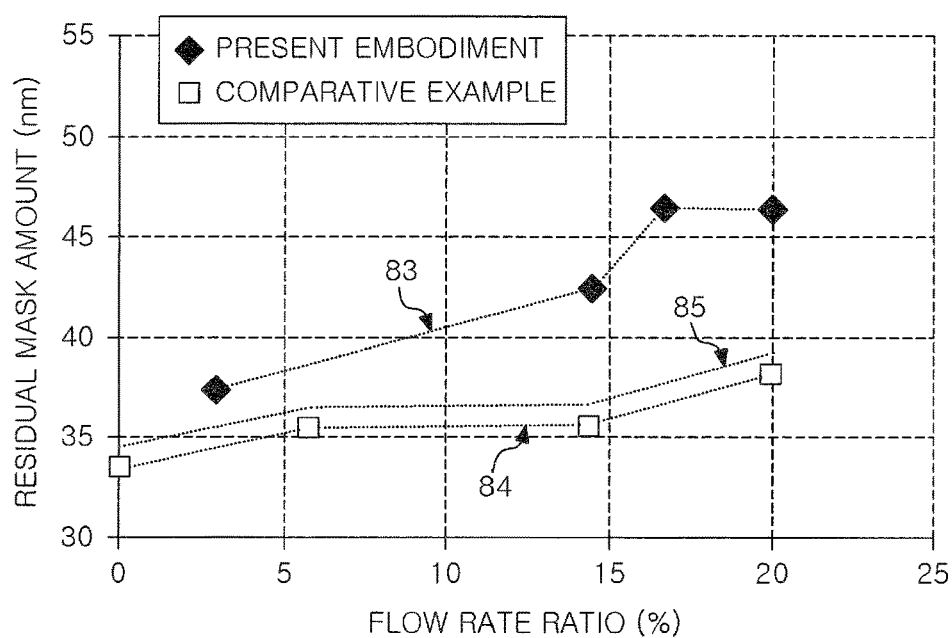
FIG. 27 shows an example of relation between a flow rate ratio and a residual mask amount.

Changes in the residual mask amount with respect to the flow rate ratio are shown in FIG. 27, for example. FIG. 27 shows an example of relation between the flow rate ratio and the residual mask amount. In FIG. 27, the data of the embodiment shown in FIG. 20 and the data of the comparative example shown in FIG. 25 are plotted together. Referring to the result of FIG. 27, in the case of repeating the first etching step and the second etching step alternately as in the present embodiment, the residual mask amount was greater than that in the comparative example (conventional case) at any flow rate ratio. Specifically, in FIG. 27, values on a line 83 indicating the trend of the residual mask amount in the present embodiment are greater than any value on a line 85 considering the measurement variation of 1 nm from a line 84 indicating the trend of the residual mask amount in the comparative example. Accordingly, when the flow rate ratio of the average flow rate of the COS gas to the average flow rate of the $O_2$ gas is 20% or less, the value of Δ(Bow–BTM) can become smaller than that in the conventional case and the residual mask amount can become greater than that in the conventional case.

As clear from the description of the embodiment of the etching apparatus 10, the etching apparatus 10 of the present embodiment can suppress the bowing of the groove formed in the organic film.

Other Embodiments

The present disclosure is not limited to the above-described embodiments, and various modifications can be made within the scope of the gist thereof.

For example, in the above embodiment, the flow rate of the $O_2$ gas is controlled to be constant in the first etching step and the second etching step, whereas the flow rate of the COS gas is controlled to a predetermined value in the first etching step and the supply of the COS gas was stopped in the second etching step. However, the disclosed technique is not limited thereto, and the COS gas may be supplied in the second etching step when the flow rate ratio of the COS gas to the $O_2$ gas in the first etching step is greater than the flow rate ratio of the COS gas to the $O_2$ gas in the second etching step.

In the above embodiment, the flow rate ratio of the COS gas to the $O_2$ gas in the first etching step is controlled to be greater than the flow rate ratio of the COS gas to the $O_2$ gas in the second etching step. However, the disclosed technique is not limited thereto, and the flow rate ratio of the COS gas to the $O_2$ gas in the first etching step is controlled to be smaller than the flow rate ratio of the COS gas to the $O_2$ gas in the second etching in step. In other words, since the first etching step and the second etching step are alternately repeated, the flow rate ratio in any one of the steps may be greater.

In the above embodiment, the flow rate of the $O_2$ gas is controlled to be constant in the first etching step and the second etching step, and the flow rate of the COS gas is changed between the first etching step and the second etching step. However, the disclosed technique is not limited thereto. For example, the flow rate of the $O_2$ gas may be changed between the first etching step and the second etching step. Further, the flow rate of COS may be controlled to be constant in the first etching step and the second etching step, and the flow rate of the $O_2$ gas may be changed between the first etching step and the second etching step.

In the above embodiment, the flow rate of the COS gas is changed in a stepped manner between the predetermined flow rate and zero. However, the disclosed technique is not limited thereto. For example, the flow rate of the COS gas may be gradually changed in a plurality of stages between a predetermined flow rate and zero, and may be gradually changed continuously between a predetermined flow rate and zero.

In the above embodiment, the $O_2$ gas is used as an example of the first gas containing oxygen. However, the disclosed technique is not limited thereto, and the first gas containing oxygen may include at least one of $O_2$ gas, CO gas and $CO_2$ gas.

In the above embodiment, the COS gas is used as an example of the second gas containing sulfur. However, the disclosed technique is not limited thereto, and the second gas containing sulfur may include at least one of COS gas, SO gas, $SO_2$ gas and $SF_6$ gas.

In the above embodiment, the etching apparatus 10 for performing etching using a capacitively coupled plasma has been described as an example of a plasma source. However, the disclosed technique is not limited thereto. The plasma source is not limited to the capacitively coupled plasma, and the etching apparatus 10 for performing etching by using plasma may use any plasma source, e.g., an inductively coupled plasma, a microwave plasma, a magnetron plasma, or the like.

While the present disclosure has been shown and described with respect to the embodiments, it will be understood by those skilled in the art that various changes and modifications may be made without departing from the scope of the present disclosure as defined in the following claims.

What is claimed is:

1. An etching method comprising:
    a loading step of loading into a chamber a target substrate in which a mask film is laminated on an organic film;
    a first etching step of etching the organic film below the mask film by plasma of a processing gas in which a flow rate ratio of a second gas containing sulfur to a first gas containing oxygen is set to a first flow rate ratio; and
    a second etching step of further etching the organic film by plasma of a processing gas in which a flow rate ratio of the second gas to the first gas is set to a second flow rate ratio different from the first flow rate ratio,
    wherein the second gas is COS (carbonyl sulfate) gas and the first etching step and the second etching step are alternately performed multiple times.

2. The etching method of claim 1, wherein the first gas contains at least one of $O_2$ gas, CO gas and $CO_2$ gas.

3. The etching method of claim 1, wherein the first etching step and the second etching step are performed alternately such that a ratio of a processing time of the first etching step to a total processing time of the first etching step and the second etching step is within a range from 30% to 90%.

4. The etching method of claim 3, wherein a total processing time of a single first etching step and a single second etching is 5 seconds or less.

5. The etching method of claim 1, wherein in the first etching step, the first gas is supplied into the chamber at a first flow rate and the second gas is supplied into the chamber at a second flow rate, and
    wherein in the second etching step, the first gas is supplied into the chamber at the first flow rate, and the second gas is supplied into the chamber at a third flow rate smaller than the second flow rate.

6. The etching method of claim 5, wherein the flow rate of the second gas is changed in a stepped manner between the second rate and the third flow rate.

7. The etching method of claim 5, wherein the third flow rate is 0.

8. The etching method of claim 5, wherein a flow rate ratio of an average flow rate of the second gas supplied into the chamber in the first etching step and the second etching step to an average flow rate of the first gas supplied into the chamber in the first etching step and the second etching step is 20% or less.

9. An etching apparatus comprising:
    a chamber into which a target substrate having an organic film and a mask film laminated on the organic film is loaded;
    a gas supply unit configured to supply a first gas containing oxygen and a second gas containing sulfur into the chamber;
    an etching processing wait configured to etch the organic film below the mask film by plasma of a processing gas supplied into the chamber; and
    a control unit configured to control a flow rate ratio of the second gas to the first gas,
    wherein the control unit is configured to perform:
    a first etching step in which the gas supply unit is controlled to set the flow rate ratio to a first flow rate and the etching processing unit is controlled to etch the organic film by plasma of the processing gas having the first flow rate ratio; and
    a second etching step in which the supply unit is controlled to set the flow rate ratio to a second flow rate ratio different from the first flow rate ratio and the etching processing unit is controlled to further etch the organic film by plasma of the processing gas having the second flow rate ratio,
    wherein the second gas is COS (carbonyl sulfate) gas and the first etching step and the second etching step are alternately repeated multiple times in etching the organic film.

* * * * *